United States Patent
Gokita

(10) Patent No.: US 8,409,969 B2
(45) Date of Patent: Apr. 2, 2013

(54) OPTICAL DEVICE WAFER PROCESSING METHOD

(75) Inventor: Yohei Gokita, Ota-Ku (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 13/223,851

(22) Filed: Sep. 1, 2011

(65) Prior Publication Data

US 2012/0061010 A1     Mar. 15, 2012

(30) Foreign Application Priority Data

Sep. 14, 2010   (JP) ................................ 2010-205939

(51) Int. Cl.
*H01L 21/78*      (2006.01)
(52) U.S. Cl. ................. 438/462; 257/E21.599
(58) Field of Classification Search .......... None
See application file for complete search history.

(56) References Cited

U.S. PATENT DOCUMENTS

| 2004/0137699 A1* | 7/2004 | Kurosawa ..................... 438/460 |
| 2007/0155131 A1* | 7/2007 | Contes .......................... 438/458 |
| 2011/0097875 A1* | 4/2011 | Gokita et al. ................. 438/462 |

FOREIGN PATENT DOCUMENTS

JP      10-305420      11/1998

* cited by examiner

*Primary Examiner* — Seahvosh Nikmanesh
(74) *Attorney, Agent, or Firm* — Greer, Burns & Crain, Ltd.

(57) ABSTRACT

An optical device wafer has a device area where a plurality of optical devices are formed on the front side of a sapphire substrate, and a peripheral marginal area surrounding the device area. The device area projects from the peripheral marginal area. A break start point is formed on the front side of the sapphire substrate by applying a laser beam along the boundary between the device area and the peripheral marginal area. A protective member is attached to the front side of the optical device wafer. The optical device wafer is held on a chuck table of a grinding apparatus so that the protective member comes into contact with a holding surface of the chuck table. The back side of the sapphire substrate is ground to reduce the thickness thereof to a predetermined thickness.

3 Claims, 8 Drawing Sheets

OPTICAL DEVICE WAFER PROCESSING METHOD

BACKGROUND OF THE INVENTION

1. Field of the Invention

The present invention relates to an optical device wafer processing method for grinding an optical device wafer to reduce the thickness thereof to a predetermined thickness, wherein a plurality of crossing streets are formed on the front side of a sapphire substrate to thereby partition a plurality of regions where a plurality of optical devices are correspondingly formed, each optical device being formed from a gallium nitride compound semiconductor, for example.

2. Description of the Related Art

An optical device wafer has a configuration such that a plurality of crossing division lines called streets are formed on the front side of a sapphire substrate to thereby partition a plurality of regions where a plurality of optical devices are correspondingly formed, each optical device being formed from a gallium nitride compound semiconductor. The optical device wafer is divided along the streets to obtain the individual optical devices such as light emitting diodes, which are widely used in electrical equipment (see Japanese Patent Laid-Open No. Hei 10-305420, for example).

The optical device wafer is formed by growing a semiconductor layer of a gallium nitride compound or the like constituting the optical devices on the front side of a substrate. Accordingly, sapphire effective for the growth of the semiconductor layer is used as the substrate. To improve the luminance, the back side of the sapphire substrate constituting the optical device wafer is ground to reduce the thickness of the wafer to about 100 µm.

SUMMARY OF THE INVENTION

The optical device wafer has an optical device area formed from an optical device layer on the front side of a sapphire substrate having a thickness of about 1300 µm and a peripheral marginal area surrounding the optical device area and having a width of about 3 mm, wherein the optical device area projects from the peripheral marginal area by about 30 µm. When the thickness of the wafer is reduced to about 200 µm in grinding the back side of the sapphire substrate constituting the optical device wafer having a difference in height between the optical device area and the peripheral marginal area, there arises a problem such that a crack is generated from the boundary between the optical device area and the peripheral marginal area due to the deformation of the peripheral marginal area and this crack reaches the optical device area to cause damage to the optical devices.

It is therefore an object of the present invention to provide an optical device wafer processing method which can grind the back side of a sapphire substrate to reduce the thickness thereof to a predetermined thickness without damaging the optical devices formed on the front side of the sapphire substrate.

In accordance with an aspect of the present invention, there is provided a processing method for an optical device wafer having a device area where a plurality of optical devices are formed on the front side of a sapphire substrate and a peripheral marginal area surrounding the device area, the device area projecting from the peripheral marginal area, the processing method including a break start point forming step of applying a laser beam along the boundary between the device area and the peripheral marginal area of the optical device wafer to thereby form a break start point on the front side of the sapphire substrate; a protective member attaching step of attaching a protective member to the front side of the optical device wafer; and a back grinding step of holding the optical device wafer on a chuck table of a grinding apparatus in the condition where the protective member attached to the front side of the optical device wafer comes into contact with a holding surface of the chuck table after performing the break start point forming step and the protective member attaching step, and next grinding the back side of the sapphire substrate to reduce the thickness thereof to a predetermined thickness.

Preferably, the break start point forming step includes the step of applying a laser beam having an absorption wavelength to the sapphire substrate from the front side of the optical device wafer to thereby form a laser processed groove as the break start point along the boundary between the device area and the peripheral marginal area.

Alternatively, the break start point forming step includes the step of applying a laser beam having a transmission wavelength to the sapphire substrate in the condition where the focal point of the laser beam is set inside of the sapphire substrate to thereby form a modified layer as the break start point inside of the sapphire substrate on the front side along the boundary between the device area and the peripheral marginal area.

In the optical device wafer processing method according to the present invention, a laser beam is applied along the boundary between the device area and the peripheral marginal area of the optical device wafer to thereby form a break start point on the front side of the sapphire substrate along this boundary, thus performing the break start point forming step. Thereafter, a protective member is attached to the front side of the optical device wafer. Thereafter, the optical device wafer is held on the chuck table of the grinding apparatus in the condition where the protective member comes into contact with the holding surface of the chuck table, and the back side of the sapphire substrate is next ground to reduce the thickness of the optical device wafer, thus performing the back grinding step. Accordingly, when the thickness of the sapphire substrate is reduced in performing the back grinding step, a crack is generated from the break start point formed along the boundary between the device area and the peripheral marginal area toward the back side of the sapphire substrate. As a result, the boundary is broken to thereby separate the device area from the peripheral marginal area. Accordingly, it is possible to solve the problem that a crack may be generated from the boundary between the device area and the peripheral marginal area toward the device area, causing damage to the optical devices.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1A:
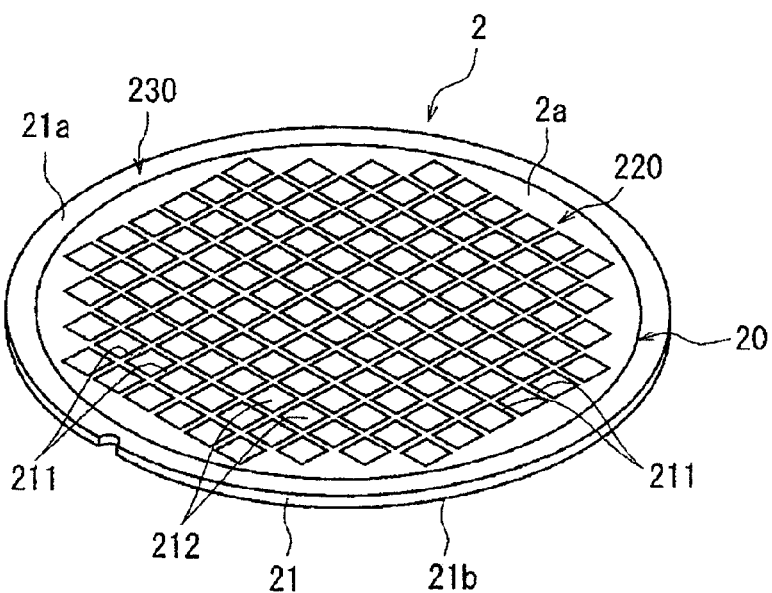
FIG. 1A is a perspective view of an optical device wafer to be processed by the optical device wafer processing method according to the present invention.
Figure 1B:
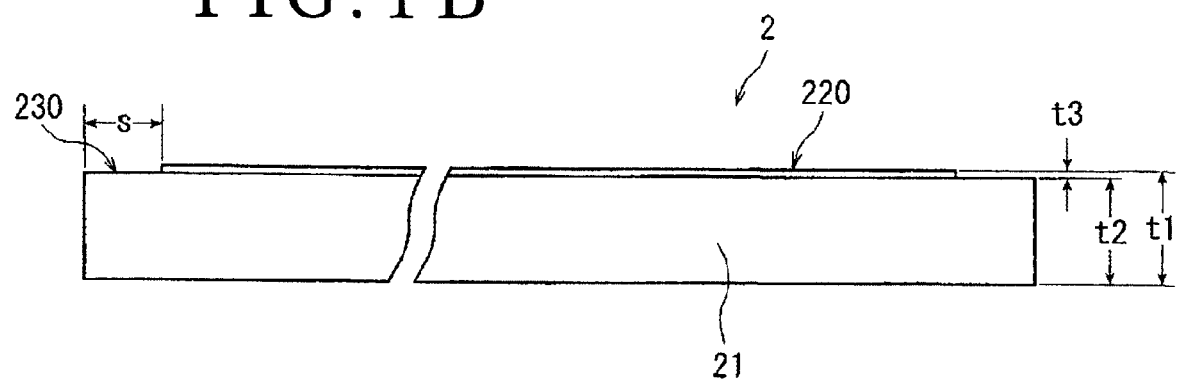
FIG. 1B is an elevational view of the optical device wafer shown in FIG. 1A.

Some preferred embodiments of the optical device wafer processing method according to the present invention will now be described in detail with reference to the attached drawings. FIGS. 1A and 1B are a perspective view and an elevational view, respectively, of an optical device wafer 2 to be processed by the optical device wafer processing method according to the present invention.

The optical device wafer 2 shown in FIGS. 1A and 1B has a device area 220 where a plurality of optical devices 212 are formed in a plurality of regions partitioned by a plurality of crossing streets 211 formed on the front side 21a of a sapphire substrate 21 and also has a peripheral marginal area 230 surrounding the device area 220. Each optical device 212 is formed from a gallium nitride compound semiconductor, for example. The optical device wafer 2 is formed so that the device area 220 projects from the peripheral marginal area 230. For example, the optical device wafer 2 has a size such that the total thickness (t1) of the optical device wafer 2 is 1300 μm, the thickness (t2) of the sapphire substrate 21 is 1270 μm, the difference (t3) in height between the device area 220 and the peripheral marginal area 230 is 30 μm, and the width (s) of the peripheral marginal area 230 is 3 mm.

There will now be described a processing method of grinding the back side 21b of the sapphire substrate 21 constituting the optical device wafer 2 to reduce the thickness of the optical device wafer 2 to a predetermined thickness (e.g., 140 μm). Prior to grinding the back side 21b of the sapphire substrate 21, a break start point forming step is performed in such a manner that a laser beam is applied to the optical device wafer 2 along the boundary between the device area 220 and the peripheral marginal area 230 to thereby form a break start point on the front side 21a of the sapphire substrate 21. This break start point forming step is performed by using a laser processing apparatus 3 shown in FIG. 2. The laser processing apparatus 3 shown in FIG. 2 includes a chuck table 31 for holding a workpiece and laser beam applying means 32 for applying a laser beam to the workpiece held on the chuck table 31.

The chuck table 31 is so configured as to hold the workpiece under suction. The chuck table 31 is movable in a feeding direction shown by an arrow X in FIG. 2 by a feeding mechanism (not shown) and also movable in an indexing direction shown by an arrow Y in FIG. 2 by an indexing mechanism (not shown). The laser beam applying means 32 includes a cylindrical casing 321 extending in a substantially horizontal direction and focusing means 322 mounted at the front end of the cylindrical casing 321 for applying a pulsed laser beam. The laser processing apparatus 3 further includes imaging means 33 mounted on the front end portion of the casing 321 constituting the laser beam applying means 32. The imaging means 33 includes illuminating means for illuminating the workpiece, an optical system for capturing an area illuminated by the illuminating means, and an imaging device (CCD) for imaging the area captured by the optical system. An image signal output from the imaging means 33 is transmitted to control means (not shown).

Figure 2:
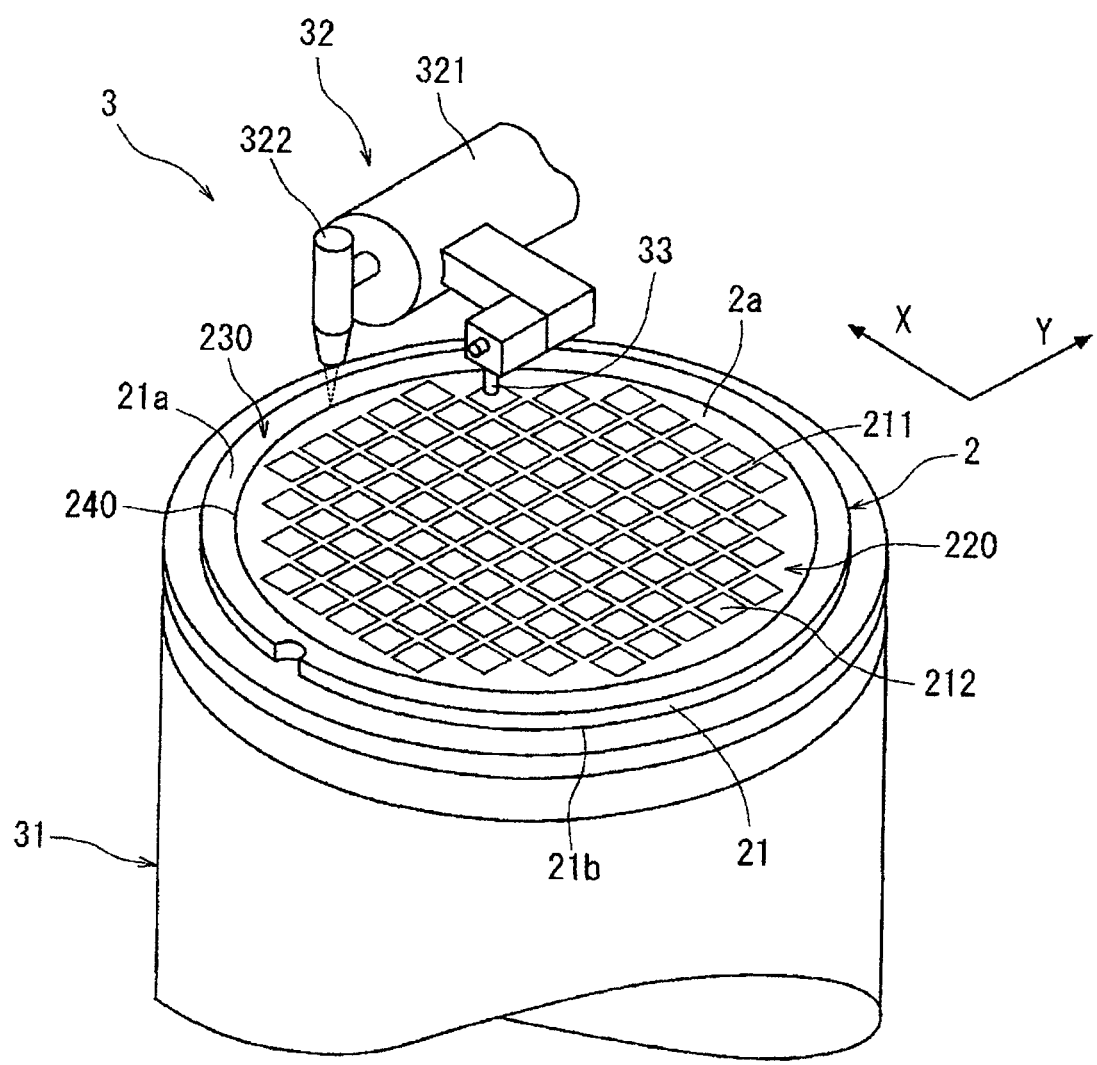
FIG. 2 is a perspective view of an essential part of a laser processing apparatus for performing a break start point forming step in the optical device wafer processing method according to the present invention.

A first preferred embodiment of the break start point forming step to be performed by using the laser processing apparatus 3 will now be described with reference to FIGS. 2 to 3B. The first preferred embodiment of the break start point forming step is performed in the following manner. As shown in FIG. 2, the optical device wafer 2 is placed on the chuck table 31 of the laser processing apparatus 3 in the condition where the back side 21b of the sapphire substrate 21 constituting the optical device wafer 2 comes into contact with the upper surface of the chuck table 31. By operating suction means (not shown), the optical device wafer 2 is held under suction on the chuck table 31. Accordingly, the front side 2a of the optical device wafer 2 held under suction on the chuck table 31 is oriented upward. By operating the feeding mechanism not shown, the chuck table 31 is moved to a processing area where the optical device wafer 2 is to be processed by the laser beam applying means 32. That is, as shown in FIGS. 2 and 3A, the chuck table 31 is moved to a position where the boundary 240 between the device area 220 and the peripheral marginal area 230 of the optical device wafer 2 held on the chuck table 31 is positioned directly below the focusing means 322 of the laser beam applying means 32.

Figure 3A:
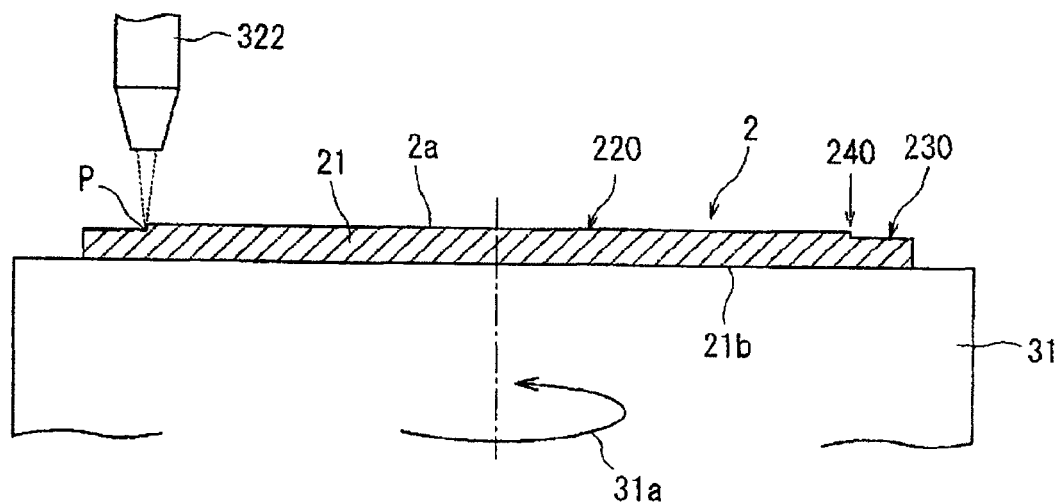
FIGS. 3A and 3B are sectional views for illustrating a laser processed groove forming step as a preferred embodiment of the break start point forming step.
Figure 3B:
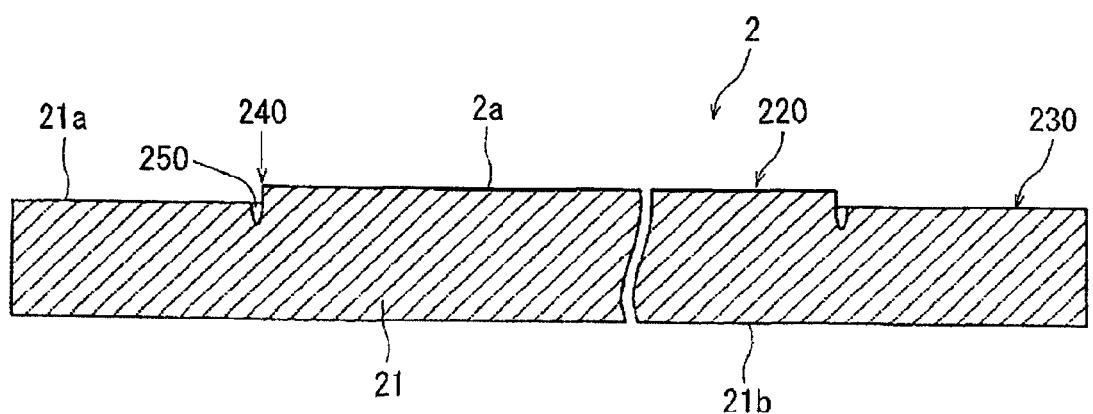

As shown in FIG. 3A, the laser beam applying means 32 is next operated to apply a pulsed laser beam having an absorption wavelength (e.g., 355 nm) to the sapphire substrate 21 from the focusing means 322 to the front side 2a of the optical device wafer 2 as rotating the chuck table 31 in the direction shown by an arrow 31a in FIG. 3A. At this time, the focal point P of the pulsed laser beam to be applied from the focusing means 322 is set near the front side 21a of the sapphire substrate 21. As a result, when the chuck table 31 is rotated 360°, a laser processed groove 250 as the break start point is formed along the boundary 240 between the device area 220 and the peripheral marginal area 230 on the front side 21a of the sapphire substrate 21 constituting the optical device wafer 2 as shown in FIG. 3B (laser processed groove forming step).

For example, the laser processed groove forming step mentioned above as the break start point forming step is performed under the following processing conditions.

Light source: LD pumped Q-switched Nd:YVO4 pulsed laser
Wavelength: 355 nm (third-harmonic generation of YVO4 laser)
Average power: 1.5 W
Repetition frequency: 100 kHz
Focused spot diameter: 1 μm
Rotational speed of chuck table: 75.22 degrees/sec By performing the laser processed groove forming step under the above-mentioned processing conditions, the laser processed groove 250 having a depth of about 40 μm from the front side 21a of the sapphire substrate 21 is formed along the boundary 240 between the device area 220 and the peripheral marginal area 230 on the sapphire substrate 21 of the optical device wafer 2. The deeper the laser processed groove 250 as the break start point, the more effective. To increase the depth of the laser processed groove 250, the laser processed groove forming step must be performed plural times or the power of the laser beam must be increased. Accordingly, in consideration of productivity and economy, the depth of the laser processed groove 250 is set to about 40 µm in this preferred embodiment as the depth of obtaining the effect of break of the sapphire substrate 21.

Figure 4A:
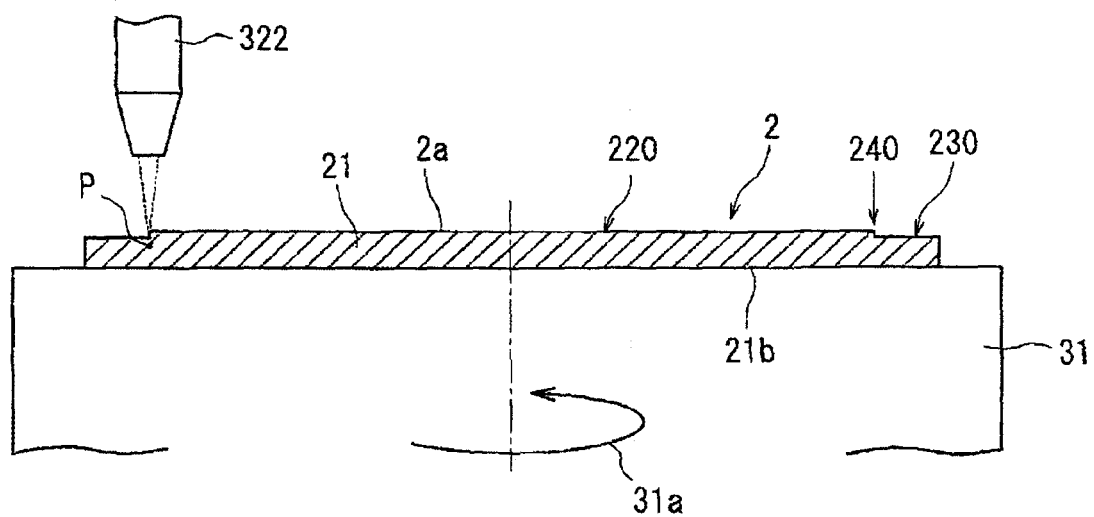
FIGS. 4A and 4B are sectional views for illustrating a modified layer forming step as another preferred embodiment of the break start point forming step.
Figure 4B:
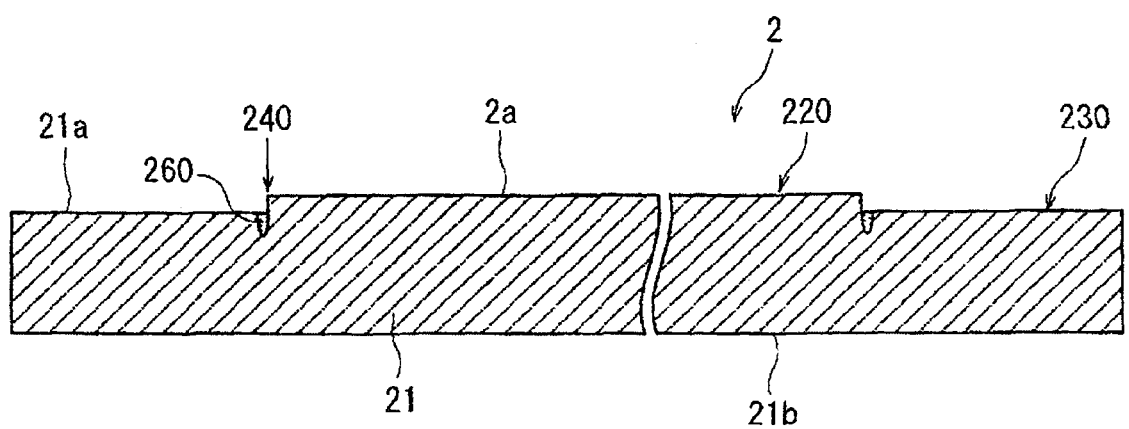

A second preferred embodiment of the break start point forming step to be performed by using the laser processing apparatus 3 will now be described with reference to FIGS. 4A and 4B. As in the first preferred embodiment mentioned above, the optical device wafer 2 is placed on the chuck table 31 of the laser processing apparatus 3 in the condition where the back side 21b of the sapphire substrate 21 constituting the optical device wafer 2 comes into contact with the upper surface of the chuck table 31 as shown in FIG. 4A. By operating the suction means, the optical device wafer 2 is held under suction on the chuck table 31. Thereafter, the chuck table 31 is moved to a position where the boundary 240 between the device area 220 and the peripheral marginal area 230 of the optical device wafer 2 is positioned directly below the focusing means 322 of the laser beam applying means 32 as shown in FIG. 4A.

Thereafter, the laser beam applying means 32 is operated to apply a pulsed laser beam having a transmission wavelength (e.g., 1064 nm) to the sapphire substrate 21 from the focusing means 322 to the front side 2a of the optical device wafer 2 as rotating the chuck table 31 in the direction shown by an arrow 31a in FIG. 4A. At this time, the focal point P of the pulsed laser beam to be applied from the focusing means 322 is set inside the sapphire substrate 21 (e.g., at a depth of 20 µm from the front side 21a of the sapphire substrate 21). As a result, when the chuck table 31 is rotated 360°, a modified layer 260 as the break start point is formed along the boundary 240 between the device area 220 and the peripheral marginal area 230 on the front side 21a of the sapphire substrate 21 constituting the optical device wafer 2 as shown in FIG. 4B (modified layer forming step).

For example, the modified layer forming step mentioned above as the break start point forming step is performed under the following processing conditions.
Light source: LD pumped Q-switched Nd:YVO4 pulsed laser
Wavelength: 1064 nm
Average power: 1.5 W
Repetition frequency: 100 kHz
Focused spot diameter: 1 µm
Rotational speed of chuck table: 75.22 degrees/sec By performing the modified layer forming step under the above-mentioned processing conditions, the modified layer 260 having a depth of about 40 µm from the front side 21a of the sapphire substrate 21 is formed along the boundary 240 between the device area 220 and the peripheral marginal area 230 on the sapphire substrate 21 of the optical device wafer 2. As similar to the laser processed groove 250, the deeper the modified layer 260 as the break start point, the more effective. However, in consideration of productivity and economy, the depth of the modified layer 260 is set to about 40 µm in this preferred embodiment as the depth of obtaining the effect of break of the sapphire substrate 21 which will be described later.

While the pulsed laser beam having a transmission wavelength (e.g., 1064 nm) to the sapphire substrate 21 is applied to the front side 2a of the optical device wafer 2 in the modified layer forming step mentioned above as the break start point forming step, the pulsed laser beam having a transmission wavelength (e.g., 1064 nm) may be applied to the back side 21b of the sapphire substrate 21 constituting the optical device wafer 2 so that the focal point of the pulsed laser beam is set at a depth of 20 µm, for example, from the front side 21a of the sapphire substrate 21. In the case of applying the laser beam to the back side 21b of the sapphire substrate 21 constituting the optical device wafer 2 as mentioned above, a protective member attaching step may be performed to attach a protective member which will be described later to the front side 2a of the optical device wafer 2 prior to performing the break start point forming step.

Figure 5A:
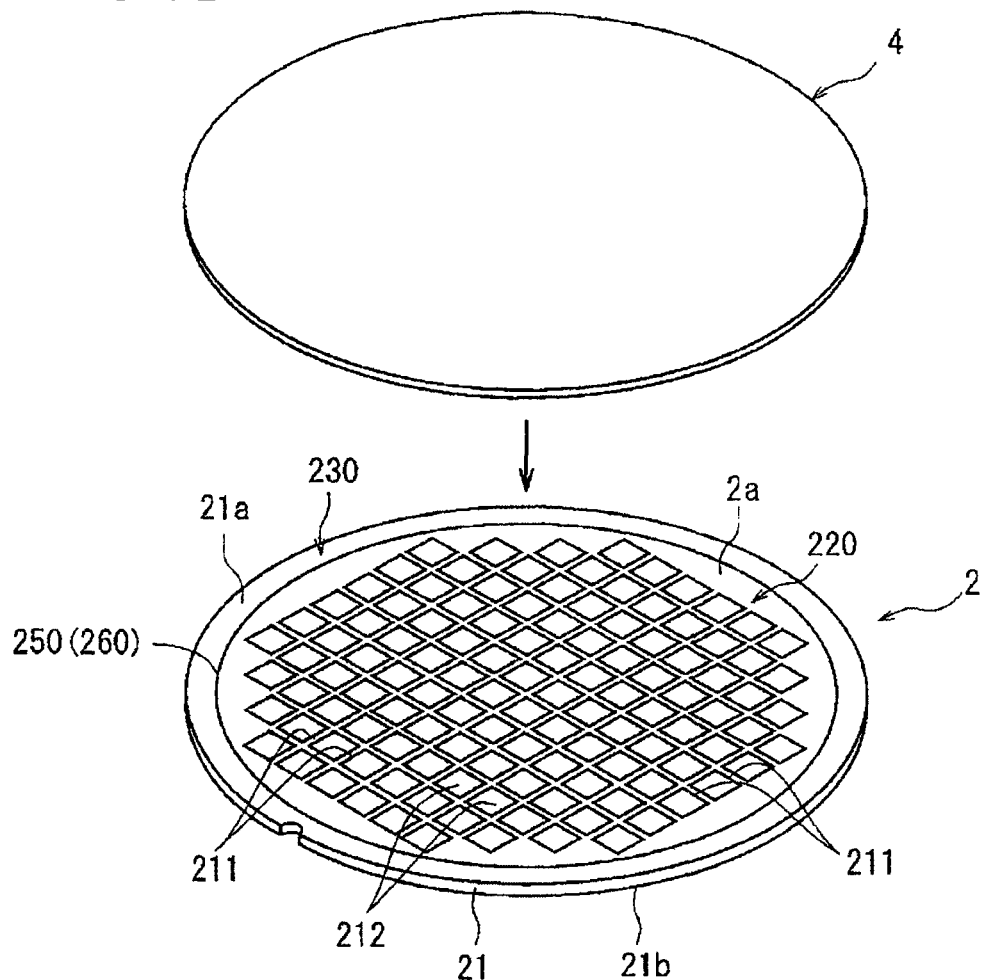
FIGS. 5A and 5B are perspective views for illustrating a protective member attaching step in the optical device wafer processing method according to the present invention.
Figure 5B:
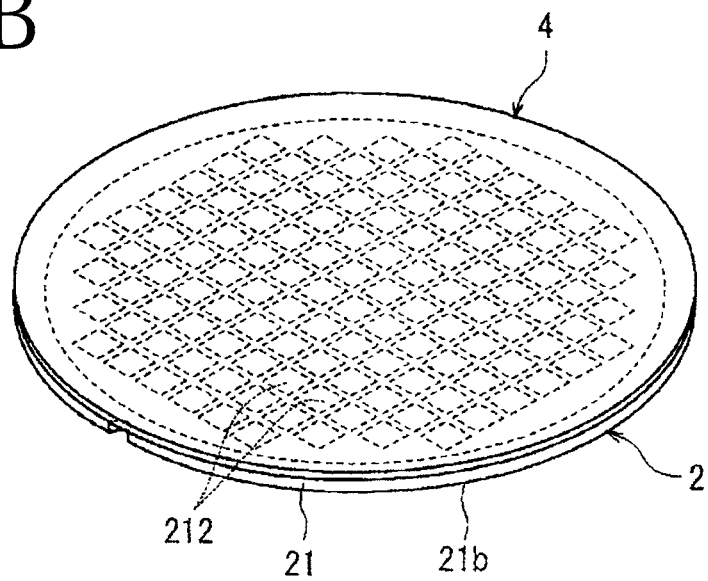

After performing the laser processed groove forming step or the modified layer forming step as the break start point forming step to thereby form the laser processed groove 250 or the modified layer 260 as the break start point along the boundary 240 between the device area 220 and the peripheral marginal area 230 on the front side 21a of the sapphire substrate 21 constituting the optical device wafer 2 as mentioned above, the protective member attaching step of attaching a protective member to the front side 2a of the optical device wafer 2 is performed. More specifically, as shown in FIGS. 5A and 5B, a protective member 4 for protecting the optical devices 212 is attached to the front side 2a of the optical device wafer 2.

After performing the protective member attaching step, a back grinding step is performed in such a manner that the optical device wafer 2 is held on a chuck table of a grinding apparatus in the condition where the protective member 4 attached to the front side 2a of the optical device wafer 2 comes into contact with the upper surface of the chuck table and that the back side 21b of the sapphire substrate 21 is next ground to reduce the thickness of the wafer 2 to a predetermined thickness. This back grinding step is composed of a coarse grinding step and a finish grinding step.

Figure 6A:
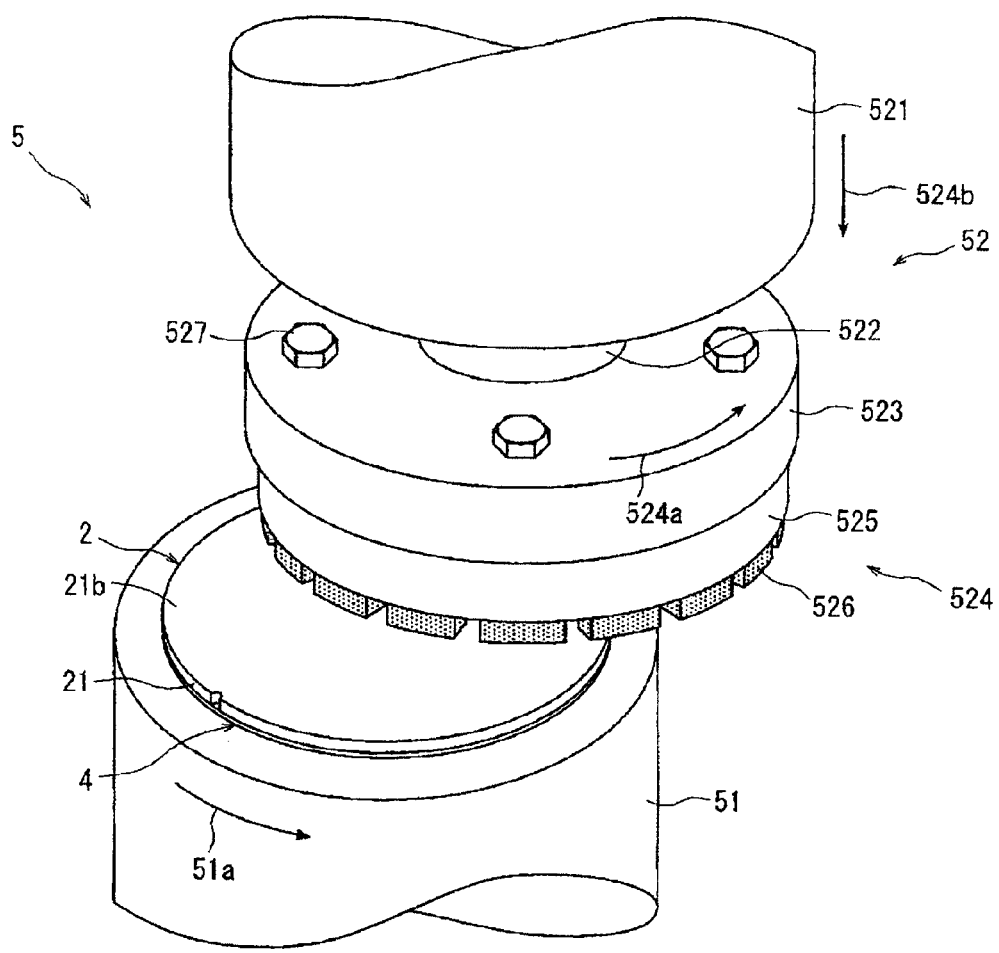
FIGS. 6A and 6B are a perspective view and a side view, respectively, for illustrating a coarse grinding step as a first step of a back grinding step in the optical device wafer processing method according to the present invention.

The coarse grinding step in the back grinding step is performed by using a grinding apparatus 5 shown in FIG. 6A. The grinding apparatus 5 shown in FIG. 6A includes a chuck table 51 for holding a workpiece and grinding means 52 for grinding the workpiece held on the chuck table 51. The chuck table 51 has an upper surface for holding the workpiece under suction. The chuck table 51 is rotatable in the direction shown by an arrow 51a in FIG. 6A. The grinding means 52 includes a spindle housing 521, a rotating spindle 522 rotatably supported to the spindle housing 521 so as to be rotated by a rotational driving mechanism (not shown), a mounter 523 mounted on the lower end of the rotating spindle 522, and a grinding wheel 524 mounted on the lower surface of the mounter 523. The grinding wheel 524 is composed of an annular base 525 and a plurality of abrasive members 526 mounted on the lower surface of the base 525 so as to be annularly arranged along the outer circumference of the base 525. The base 525 is mounted to the lower surface of the mounter 523 by a plurality of fastening bolts 527. Each abrasive member 526 constituting the grinding wheel 524 is formed by binding diamond abrasive grains having a grain size of 40 to 60 µm with a metal bond.

The coarse grinding step using this grinding apparatus 5 is performed in the following manner. First, the optical device wafer 2 is placed on the chuck table 51 in the condition where the protective member 4 attached to the front side 2a of the optical device wafer 2 comes into contact with the upper surface (holding surface) of the chuck table 51 as shown in FIG. 6A. In this condition, suction means (not shown) is operated to hold the optical device wafer 2 through the protective member 4 on the chuck table 51 under suction.

Figure 6B:
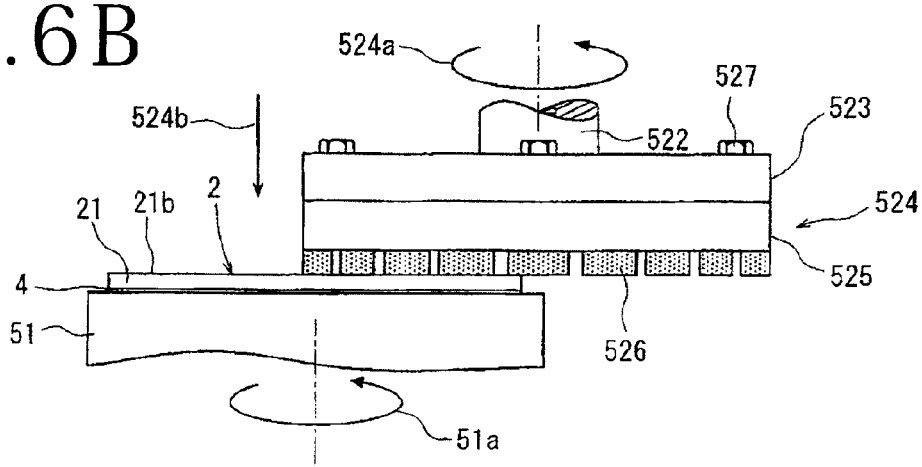

Accordingly, the back side 21b of the sapphire substrate 21 of the optical device wafer 2 held through the protective member 4 on the chuck table 51 is oriented upward. In the condition where the optical device wafer 2 is held under suction on the chuck table 51 as mentioned above, the chuck table 51 is rotated at 550 rpm, for example, in the direction shown by the arrow 51a in FIG. 6A and the grinding wheel 524 of the grinding means 52 is also rotated at 1150 rpm, for example, in the direction shown by an arrow 524a in FIG. 6A. Thereafter, the grinding wheel 524 is lowered to bring the grinding surface (lower surface) of the abrasive members 526 into contact with the back side 21b of the sapphire substrate 21 as a work surface as shown in FIG. 6B. Thereafter, the grinding wheel 524 is fed downward at a first coarse grind feed speed (e.g., 1.4 μm/sec) in the direction shown by an arrow 524b in FIGS. 6A and 6B by an amount of 985 μm, for example (in the direction perpendicular to the holding surface of the chuck table 51) (first coarse grinding step). After performing the first coarse grinding step, the feed speed of the grinding wheel 524 is changed to a second coarse grind feed speed (e.g., 1.0 μm/sec) and the grinding wheel 524 is fed by an amount of 140 μm, for example (second coarse grinding step). As a result, the back side 21b of the sapphire substrate 21 constituting the optical device wafer 2 is coarse-ground by an amount of 1125 μm in this preferred embodiment.

Figure 7A:
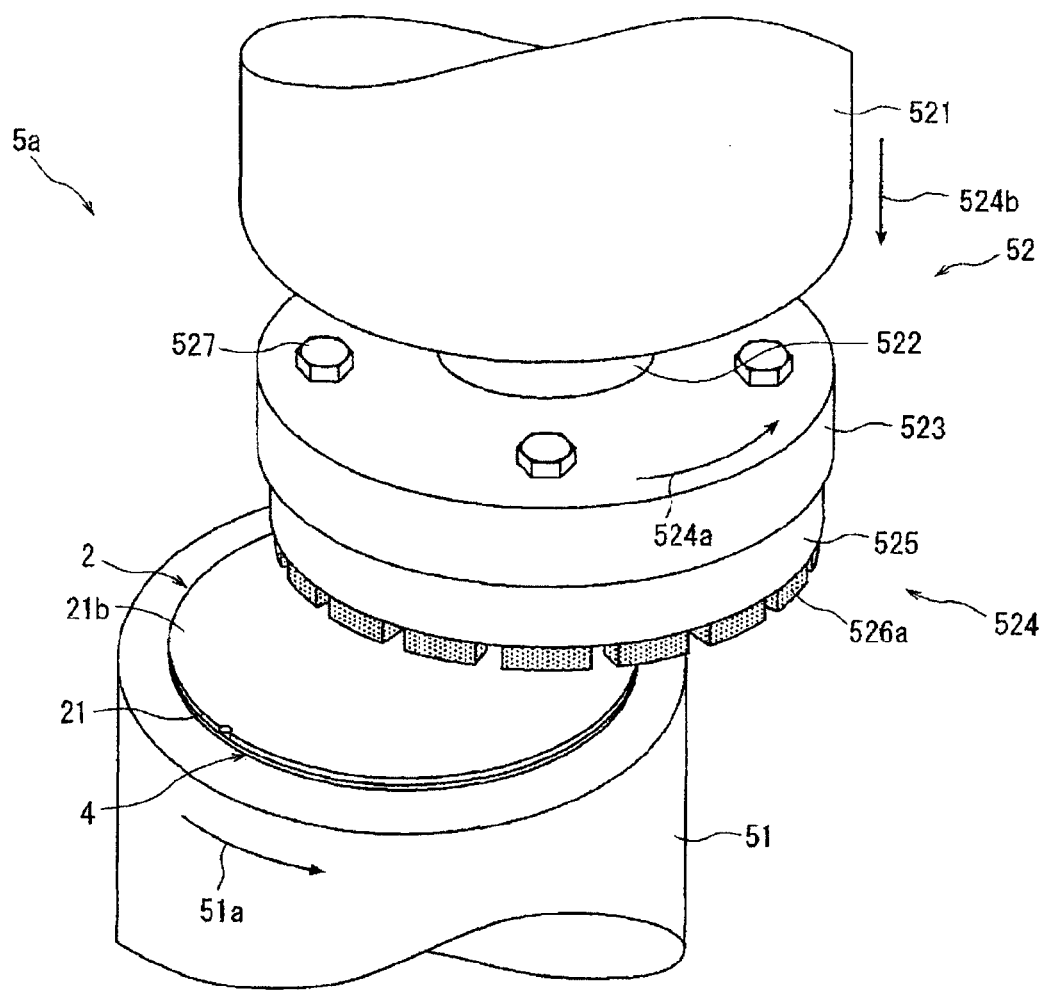
FIGS. 7A and 7B are a perspective view and a side view, respectively, for illustrating a finish grinding step as a second step of the back grinding step in the optical device wafer processing method according to the present invention.

After performing the coarse grinding step in the back grinding step, the finish grinding step is performed by using a grinding apparatus 5a shown in FIG. 7A. The grinding apparatus 5a shown in FIG. 7A is different from the grinding apparatus 5 shown in FIG. 6A only in the configuration of abrasive members 526a constituting a grinding wheel 524 shown in FIG. 7A. The other configuration is substantially the same as that shown in FIG. 6A, so substantially the same components are denoted by the same reference numerals and the description thereof will be omitted herein. Each abrasive member 526a constituting the grinding wheel 524 in the grinding apparatus 5a shown in FIG. 7A is formed by binding diamond abrasive grains having a grain size of 2 to 3 μm with a vitrified bond.

Figure 7B:
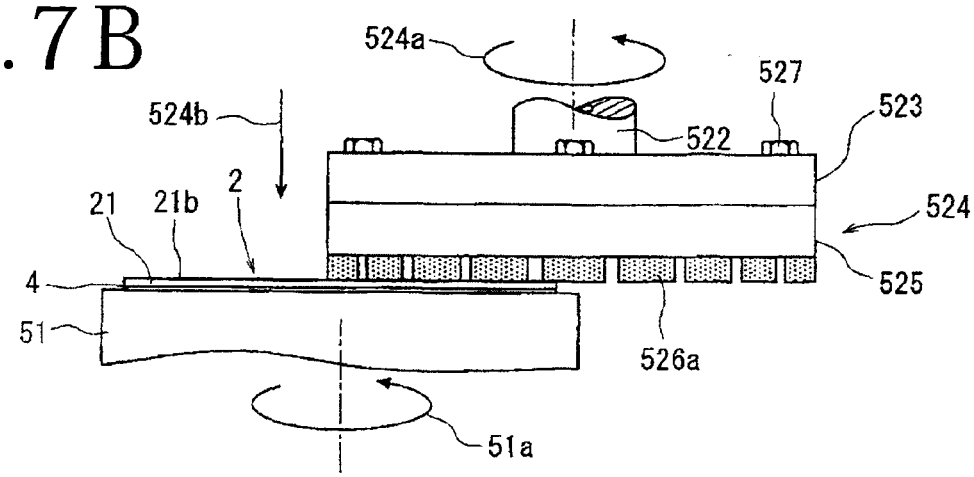

The finish grinding step using this grinding apparatus 5a is performed in the following manner. First, the optical device wafer 2 processed by coarse grinding step mentioned above is placed on the chuck table 51 in the condition where the protective member 4 attached to the front side 2a of the optical device wafer 2 comes into contact with the upper surface (holding surface) of the chuck table 51 as shown in FIG. 7A. In this condition, suction means (not shown) is operated to hold the optical device wafer 2 through the protective member 4 on the chuck table 51 under suction. Accordingly, the back side 21b of the sapphire substrate 21 of the optical device wafer 2 held through the protective member 4 on the chuck table 51 is oriented upward. In the condition where the optical device wafer 2 is held under suction on the chuck table 51 as mentioned above, the chuck table 51 is rotated at 550 rpm, for example, in the direction shown by the arrow 51a in FIG. 7A and the grinding wheel 524 of the grinding means 52 is also rotated at 1000 rpm, for example, in the direction shown by an arrow 524a in FIG. 7A. Thereafter, the grinding wheel 524 is lowered to bring the grinding surface (lower surface) of the abrasive members 526a into contact with the back side 21b of the sapphire substrate 21 as a work surface as shown in FIG. 7B. Thereafter, the grinding wheel 524 is fed downward at a predetermined finish grind feed speed (e.g., 0.35 μm/sec) in the direction shown by an arrow 524b in FIGS. 7A and 7B by an amount of 35 μm, for example (in the direction perpendicular to the holding surface of the chuck table 51). As a result, the back side 21b of the sapphire substrate 21 constituting the optical device wafer 2 is finish-ground by an amount of 35 μm, so that the thickness of the optical device wafer 2 becomes 140 μm.

Figure 8:
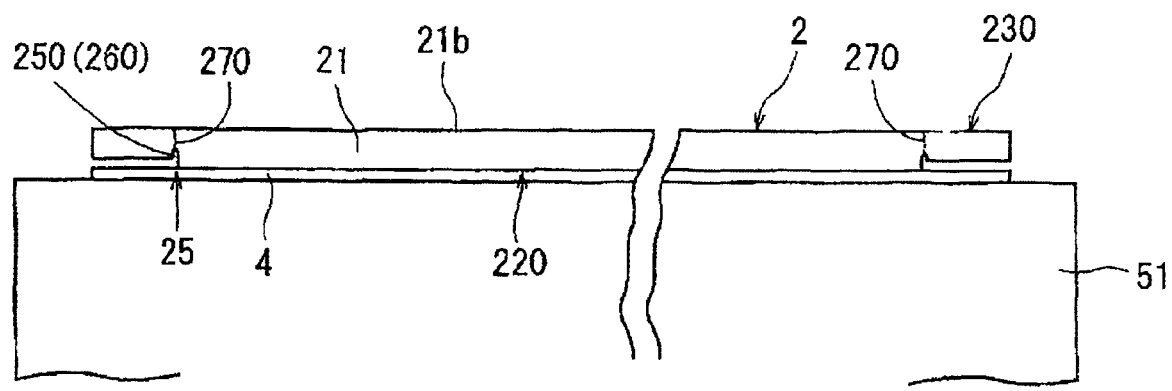
FIG. 8 is a side view for illustrating a condition where a crack is generated from the break start point formed on the front side of a sapphire substrate constituting the optical device wafer in performing the back grinding step in the optical device wafer processing method according to the present invention.

When the thickness of the sapphire substrate 21 is reduced in performing the coarse grinding step or the finish grinding step in the back grinding step, a crack 270 is generated from the laser processed groove 250 or the modified layer 260 as the break start point formed along the boundary 240 between the device area 220 and the peripheral marginal area 230 toward the back side 21b of the sapphire substrate 21 as shown in FIG. 8. Thus, the crack 270 is generated from the laser processed groove 250 or the modified layer 260 to break the boundary 240, thereby separating the device area 220 from the peripheral marginal area 230. Accordingly, it is possible to solve the problem that a crack may be generated from the boundary 240 between the device area 220 and the peripheral marginal area 230 toward the device area 220, causing damage to the optical devices 212.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A processing method for an optical device wafer having a device area where a plurality of optical devices are formed on the front side of a sapphire substrate and a peripheral marginal area surrounding said device area, said device area projecting from said peripheral marginal area, said processing method comprising:
   a break start point forming step of applying a laser beam along the boundary between said device area and said peripheral marginal area of said optical device wafer to thereby form a break start point on the front side of said sapphire substrate;
   a protective member attaching step of attaching a protective member to the front side of said optical device wafer; and
   a back grinding step of holding said optical device wafer on a chuck table of a grinding apparatus in the condition where said protective member attached to the front side of said optical device wafer comes into contact with a holding surface of said chuck table after performing said break start point forming step and said protective member attaching step, and next grinding the back side of said sapphire substrate to reduce the thickness thereof to a predetermined thickness.

2. The processing method according to claim 1, wherein said break start point forming step comprises the step of applying a laser beam having an absorption wavelength to said sapphire substrate from the front side of said optical device wafer to thereby form a laser processed groove as said break start point along the boundary between said device area and said peripheral marginal area.

3. The processing method according to claim 1, wherein said break start point forming step comprises the step of applying a laser beam having a transmission wavelength to said sapphire substrate in the condition where the focal point of said laser beam is set inside of said sapphire substrate to thereby form a modified layer as said break start point inside of said sapphire substrate on the front side along the boundary between said device area and said peripheral marginal area.

* * * * *